United States Patent
Oberschmidt et al.

(10) Patent No.: US 6,704,562 B1
(45) Date of Patent: Mar. 9, 2004

(54) N-PORT RECEIVER WITH RF/LO ISOLATION

(75) Inventors: Gerald Oberschmidt, Bruchsal (DE); Veselin Brankovic, Esslingen (DE); Dragan Krupezevic, Stuttgart (DE); Masayoshi Abe, Kanagawa (JP); Thomas Dölle, Stuttgart (DE); Tino Konschak, Stuttgart (DE)

(73) Assignees: Sony International (Europe) GmbH, Berlin (DE); Sony Corporation, Tokyo (JP)

( * ) Notice: Subject to any disclaimer, the term of this patent is extended or adjusted under 35 U.S.C. 154(b) by 532 days.

(21) Appl. No.: 09/593,676

(22) Filed: Jun. 14, 2000

(30) Foreign Application Priority Data

Jun. 16, 1999 (EP) .............................. 99111683

(51) Int. Cl.[7] .................................. H04B 1/06
(52) U.S. Cl. ................. 455/344; 455/318; 375/316; 329/306
(58) Field of Search ................ 455/318, 324, 455/334, 337, 338; 375/316, 324, 330, 340; 329/306

(56) References Cited

U.S. PATENT DOCUMENTS 5,787,126 A * 7/1998 Itoh et al. .................... 375/340
6,021,315 A * 2/2000 Telewski .................... 455/67.1
6,337,888 B1 * 1/2002 Huang et al. ................ 375/322

FOREIGN PATENT DOCUMENTS

| EP | 0 265 073 | 4/1988 | |
| EP | 805561 A2 * | 11/1997 | ............ H04B/1/30 |
| EP | 0 841 756 | 5/1998 | |
| EP | 0 926 812 | 6/1999 | |

* cited by examiner

*Primary Examiner*—William Trost
*Assistant Examiner*—James Ewart
(74) *Attorney, Agent, or Firm*—Frommer Lawrence & Haug LLP; William S. Frommer; Dennis M. Smid

(57) ABSTRACT

A RF receiver for modulated RF signals based on a N-port junction (1) providing LO/RF isolation is proposed. N thereby is an integer larger than two, such that the N-port junction (1) can be preferably a three port, four port, five port and six port junction. The N-port junction (1) supplied with a first RF signal at a first input (2) and with a second RF signal originating from a local oscillator (2) at a second input (3). An isolation block (13) comprising an active circuitry (22) is comprised in the N-port junction for isolating the second input (3) from the first input (1). Thereby can be ensured that the LO signals are significantly attenuated at the RF port (2).

12 Claims, 9 Drawing Sheets

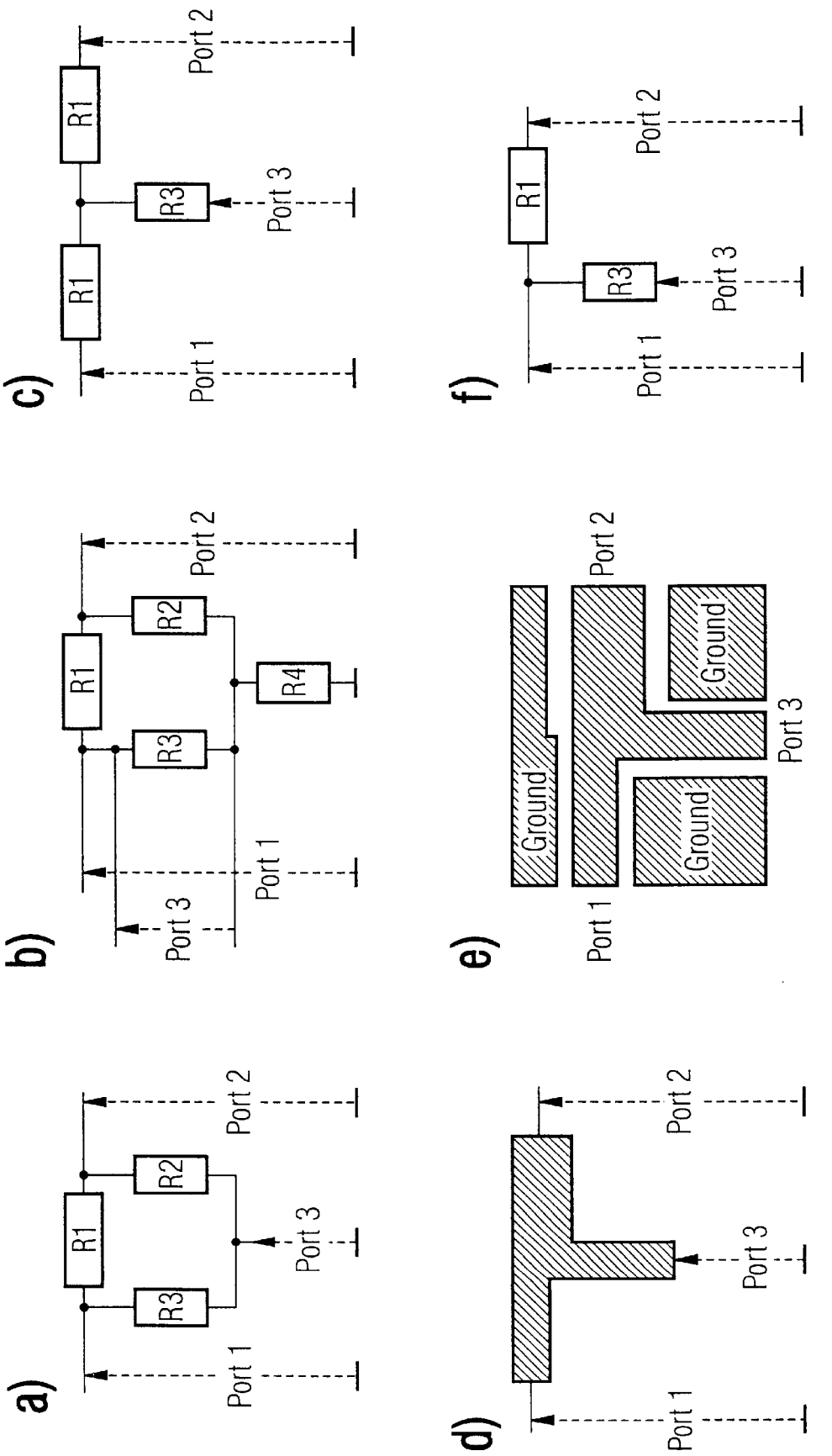

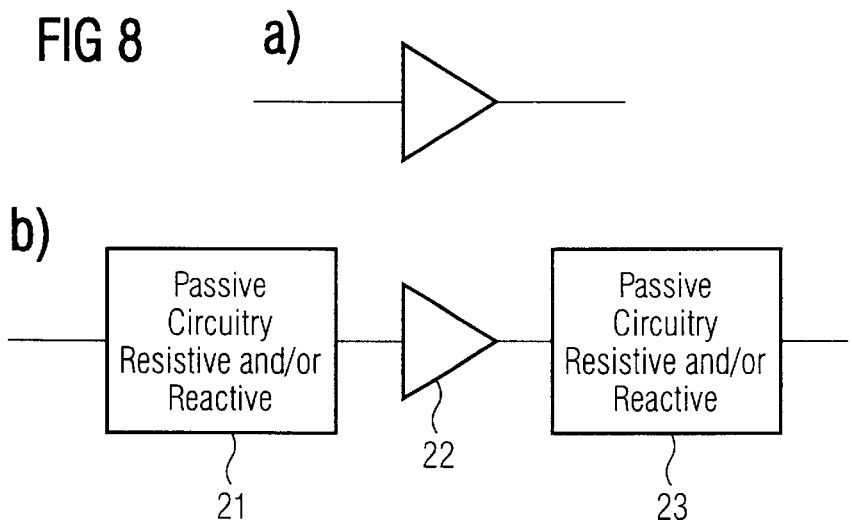
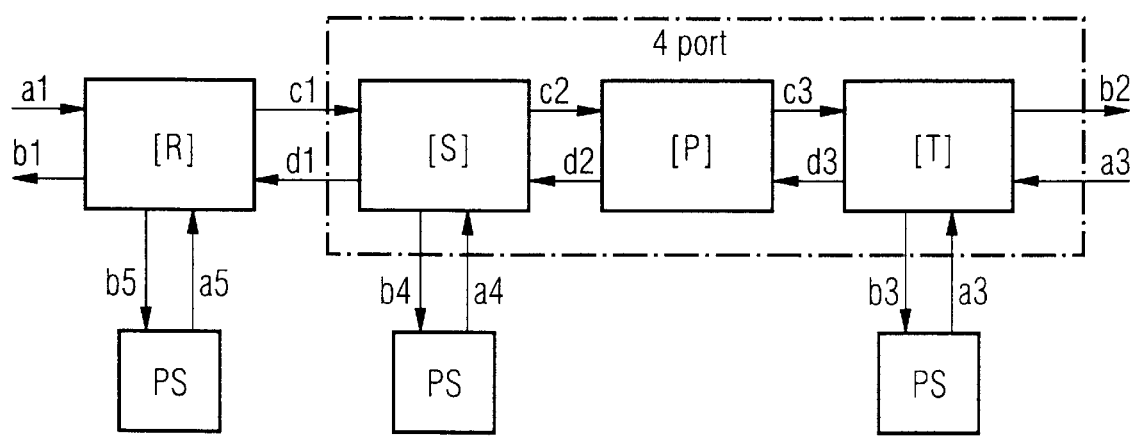

N-PORT RECEIVER WITH RF/LO ISOLATION

BACKGROUND OF THE INVENTION

The present invention generally relates to the technical field of N-port-receivers and particularly to a method for receiving modulated RF signals and a RF receiver comprising a N-port junction.

A six-port receiver is known acting in a direct conversion manner and allowing conversion from mm-wave range and microwave range directly to the base band. The six-port receiver detects the relative phase and relative magnitude of two incoming RF-signals by using the information of superimposed RF signals. At the same time a classic I/Q-demodulation chip (digital or analog) can be avoided. By using suitable calibration procedures the influences of, the non-ideal linear RF-components including manufacturing tolerances can be minimized. The circuitry of the six-port receiver is realized using only passive components in combination with power sensors for the detection of the relative phase and the relative magnitude of the RF-signals as shown in EP-A-0896455.

In Bossisio, Wu "A six-port direct digital millimeter wave receiver", Digest of 1994 IEEE MTT Symposium, vol. 3, page 1659–1662, San Diego, May 1994, a structure for a six-port receiver is proposed.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at least three different ports. The imperfections of the hardware can be readily eliminated by an appropriate calibration procedure. Very accurate measurements can be made in a large dynamic range and wide frequency range. Six-port junction receivers consist of microwave components such as e.g. directional couplers and power dividers as well as power sensors. The circuit can be easily integrated as MHMIC or MMIC. The known receiver performs direct phase/amplitude demodulation at microwave and mm-wave frequencies.

By performing a calibration procedure the hardware imperfections can be readily eliminated. This significantly eases the requirement of the hardware implementation and enables the six-port receiver to operate over a wide band up to mm-wave frequencies.

According to the above cited document of Bossisio et. al. a six-port receiver concept with power dividers and 90 degrees hybrid circuits realized in distributed technology is used. The application of that known structure lies mainly in the frequency bands above 10 GHz, however, it suffers from an insufficient band width of the operation due to the inherently frequency selective nature of the 90 degree hybrid circuits.

From D. Maurin, Y.Xu, B.Huyart, K.Wu, M. Cuhaci, R. Bossisio "CPW Millimeter-Wave Six-Port Reflectometers using MHMIC and MMIC technologies", European Microwave Conference 1994, pp. 911–915, a wide-band topology for reflectometer used is known which is based on a distributing element approach featuring coplanar wave guide applications in the frequency range from 11 to 25 GHz.

From V. Bilik, et al. "A new extremely wideband lumped six-port reflectometer" European Microwave Conference 1991, pp. 1473–1477 and the idea of using Wheatstone Bridges and resistive structures for reflectometer applications is known.

From Li, G.Bossisio, K.Wu, "Dual tone Calibration of Six-Port Junction and its application to the six-port direct digital receiver", IEEE Transactions on Microwave Theory and Techniques, vol. 40, January 1996 a six-port reflectometer topology based on four 3 dB hybrid circuits, power dividers and attenuators is known.

From U.S. Pat. No. 5,498,969 an asymmetrical topology for a reflectometer structure featuring one matched detector and three unmatched detectors is known.

From U.S. Pat. No. 4,521,728 with the title "Method and six-port network for use in determining complex reflection coefficients of microwave networks" a reflectometer six-port topology is known comprising two different quadrate hybrids, phase shifter, two power dividers and one directional coupler for which the realization by a microstrip line technology is disclosed.

From EP-A-0 805 561 a method for implementing a direct conversion receiver with a six-port junction is known. According to this known technique, modulated transmitted modulation is received by a direct conversion receiver which comprises a six-port junction. The demodulation is carried out analogically.

From EP-A-0 841 756 a correlator circuit for a six-port receiver is known. In this correlator circuit the received signal is summed up with a local oscillator signal at various phase angles, wherein the phase rotation between the local oscillator and RF signals is carried out separately from the summing of the correlator outputs.

Generally, when applying the N-port-technique as said forth above for receive a modulated RF signal, two RF signals are set to the N-port junction. In the case of a coherent reception and detection one of the supplied RF signals originates from a local oscillator. Particularly in the case of using a local oscillator for a coherent detection the following problems can arise:

The local oscillator signal (or generally spoken the second RF signal) passing through the end port junction arrives at the first RF input and can propagate further to the antenna or a preamplifier stage, is reflected there and approaches then the first RF input of the N-port junction together with the RF signal to be demodulated. Obviously this may produce demodulation errors.

In the case the N-port junction is a junction with five or more ports, there are cases that the power level detection of the RF signal to be demodulated alone is required. In such a case it is important that no local oscillator signal (generally RF signal from the second RF input of the end port junction) arrives at the power sensor to not disturb the demodulation.

SUMMARY OF THE INVENTION

In view of the prior art it is therefore the object of the present invention to provide for a RF reception technology on the basis of a N-port junction dealing with the above cited problems. In other words, with a technique according to the present invention it should be possible to avoid as far as possible unwanted influences of the RF signal from the second input (LO signal) on the power detection.

This object is achieved by means of the features of the independent claims. The dependent claims develop further the central idea of the present invention.

According to the present invention therefore a method for receiving modulated RF signals is proposed. A first RF signal is set to a first input of a N-port junction. N thereby is an integer larger than two. The N-port junction can be preferably a three port, four port, five port or six port junction. A second RF signal is set to a second input of the N-port junction. N−2 output signals of the N-port junction are supplied to power sensors for further processing. According to the invention the first input is (RF) isolated from the second input by means of a non-reciprocal two-port isolation unit.

The non-reciprocal two-port isolation unit can be an active circuitry.

Particularly in the case of a coherent reception/detection, the second RF signal can originate from a local oscillator.

According to the present invention furthermore a RF receiver for modulated RF signals is proposed. The RF receiver comprises a N-port junction, N being an integer larger than two. The N-port junction is supplied to the first RF signal in the first input and with the second RF signal in the second input. The receiver furthermore comprises an isolation block comprising a non-reciprocal two-port isolation unit for (RF) isolating the second input from the first input.

The non-reciprocal two-port isolation unit can be an active circuitry.

The active circuitry can be an amplifier.

The isolation block can furthermore comprise at least one passive circuitry providing for a resistive or reactive matching.

The isolation block can comprise resistive attenuators.

The N-port junction can comprise at least one of a three-port junction and a four-port junction and the isolation block in this case is connected between one of the first and second input of the N-port junction and the at least one of three-port junction and the four-port junction.

The N-port junction can comprise at least two three-port junctions and the isolation block in this case can be connected between the two three-port junctions.

The N-port junction can comprise at least one three-port junction and at least one four-port junction, in which case the isolation block is connected between a three-port junction and a four-port junction.

The N-port junction can comprise at least one phase shifter.

Further features, objects and advantages of the present invention will become evident for the man skilled in the art or in the reading of the following description of embodiments of the invention taken in conjunction with the figures of the enclosed drawings.

BRIEF DESCRIPTION OF THE DRAWINGS

FIG. 7 shows different embodiments for three-port structures,

FIGS. 8a and b show different implementations for an isolation block,

FIG. 9 shows a mathematical representation of a five-port junction type receiver.

DETAILED DESCRIPTION OF THE INVENTION

Figure 1:
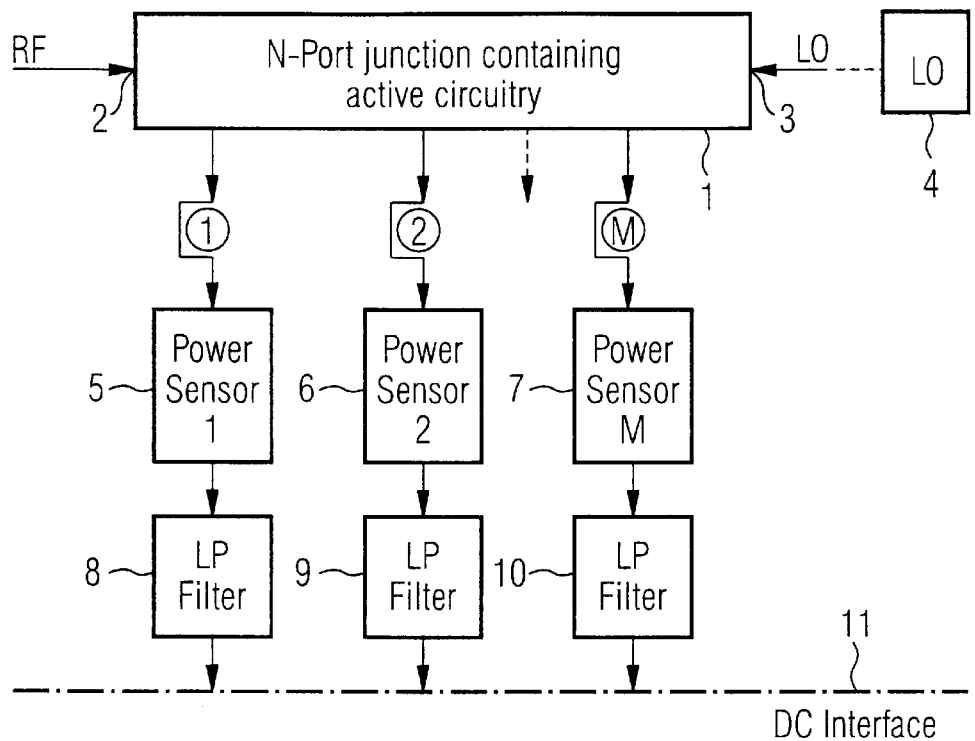
FIG. 1 shows the basic principle of a N-port-junction with isolation function according to the present invention.

The general concept of the present invention will now be explained at first with reference to FIG. 1. The RF receiver as shown comprises a N-port structure containing an active isolation circuitry as will be explained in detail further on. The N-port structure 1 has two inputs 2, 3 for a RF signal to be demodulated (input 2) and a second RF signal (input 3) originating from a local oscillator 4 according to the embodiment of FIG. 1.

The N-port junction 1 has N-ports and being n an integer larger than two. As two ports are reserved for input ports (2, 3), n−2 ports are reserved for output signals of the input junction 1. Thus the number of outputs of the N-port junction 1 is equal to.

$$M=N-2$$

Each of the output signals is supplied to a power sensor 5, 6, 7, wherein a number of M power sensors is provided. The output signals of the power sensors 5, 6, 7 are respectively supplied to a low pass filter 8, 9, 10. The output signal of the low pass filter 8, 9, 10 is supplied to a DC interface 11 for further analog or digital processing.

The general structures shown in FIG. 1 can be utilized as a base for an I/Q demodulator and converter or a demodulator for specific modulation schemes like nPSK, nQAM or similar.

As has already been said, the N-port junction contains an active isolation circuitry. Such an active isolation circuitry has advantages over externally realized solutions by passive structures, like ferrite isolators at the signal ports. Such an external solution is unpractical for different reasons: large size, frequency selectivity and cost. Another approach would be to realize the isolation block by means of passive elements using quadrature hybrids or non-reciprocal circuitry. Also this approach has drawbacks like large dimensions, frequency selectivity and power losses.

The solution according to the present invention, i.e. an active circuitry for isolation has the advantages of small size and inherent ability of disintegration with the passive circuitry.

Note that the output signals of the N-port junction 1 are linear complex combinations of the two supplied RF signals.

Figure 2:
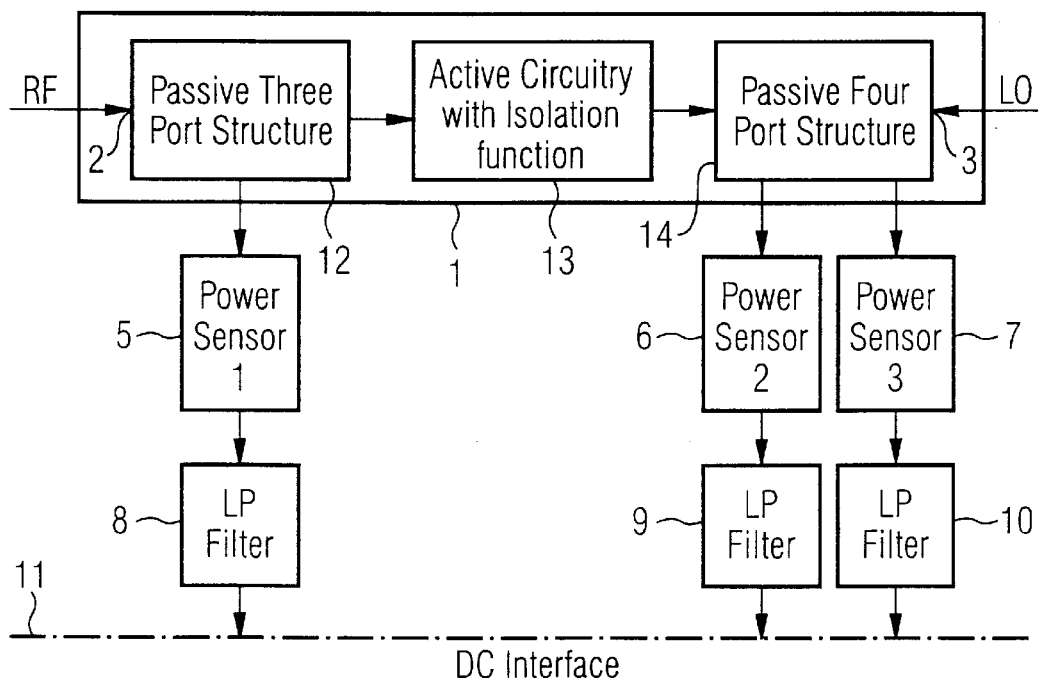
FIG. 2 shows particularly the internal structure of the N-port-junction (five-port junction in the embodiment of FIG. 2)

In FIG. 2 a five-port receiver with an active circuitry 13 with its isolation function is shown, wherein the active circuitry 13 is connected between a passive three port structure 12 and a passive four port structure 14. By the provision of a matched active circuitry with isolation function 13 a reflection of a signal from the input of the four port structure 14 is suppressed, as well as any LO signals passing through the passive four port structure 14 towards the three port structure 12.

Figure 3:
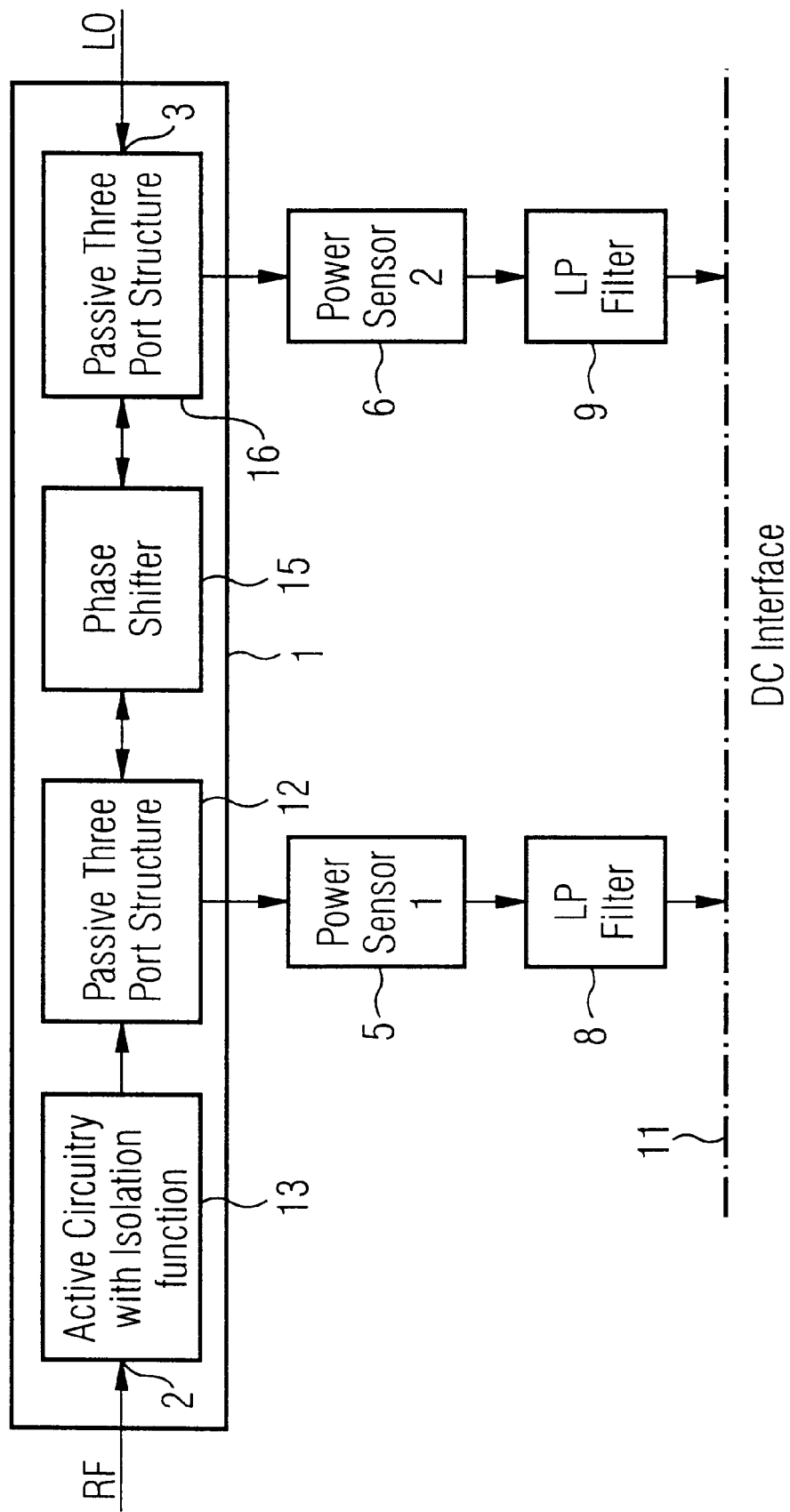
FIG. 3 shows the internal structure of the N-port-junction according to another embodiment (four-port junction)

In FIG. 3 a receiver based on a four port junction is shown. The active circuitry 13 with isolation function is connected between a passive three port structure 12 and an input 2 of the four port junction 1. The passive three port structure 12 is connected with another passive three port structure 16 by means of a phase shifter 15.

Figure 4:
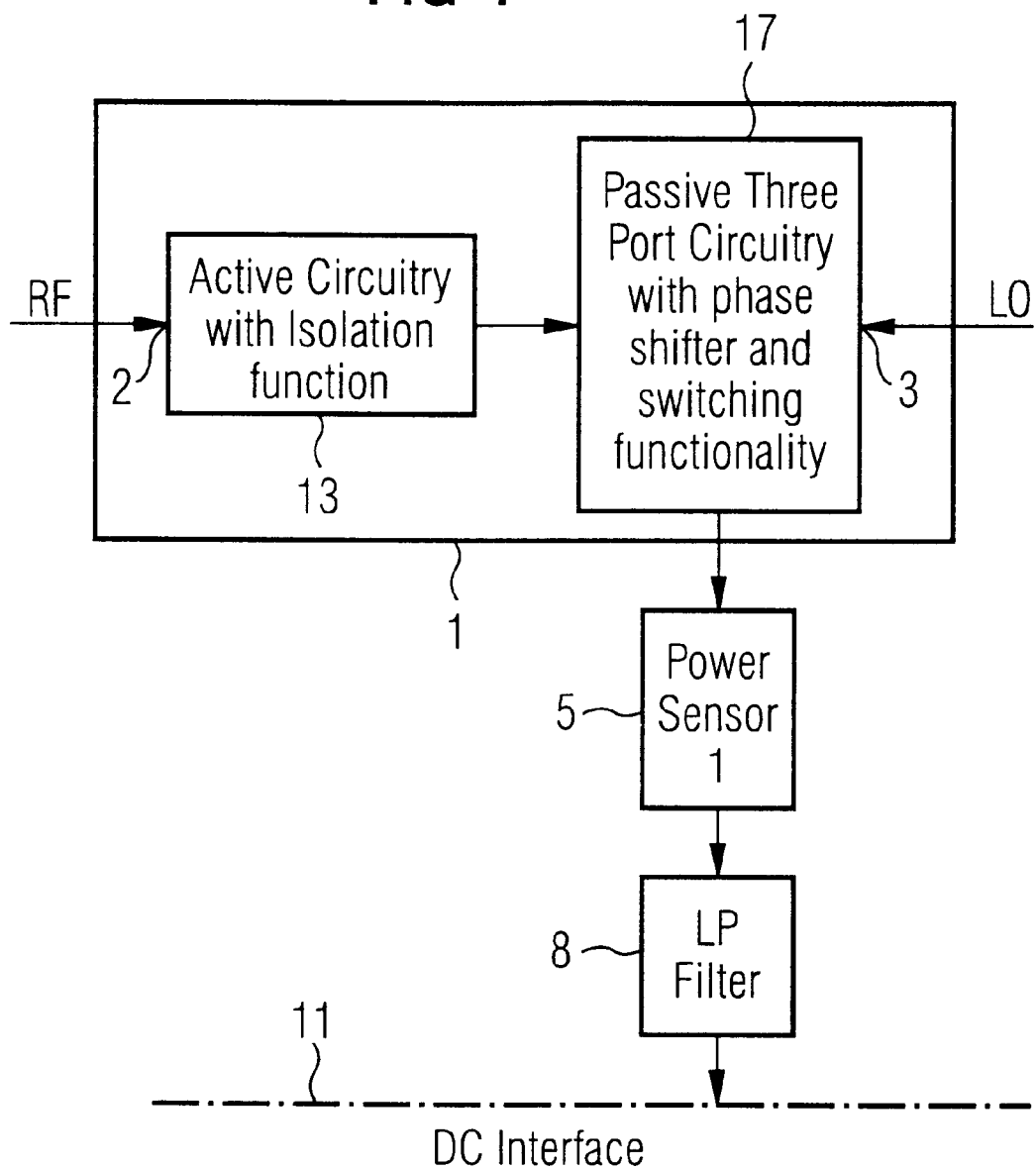
FIG. 4 shows a still further embodiment of the present invention (three-port junction with isolation function)

FIG. 4 shows a further embodiment of the present invention, i.e. a three port receiver. In this case the active circuitry 13 with isolation function is connected between a passive three port circuitry 17 and a first RF input 2. The LO-RF signal is also supplied at the input 3 to the passive circuitry 17. Only one power sensor 5 is supplied with the output signal of the passive three port circuitry 17, the output signal being a complex linear combination of the (isolated) RF signal 2 and the LO signal supplied at the terminal 3.

Figure 5:
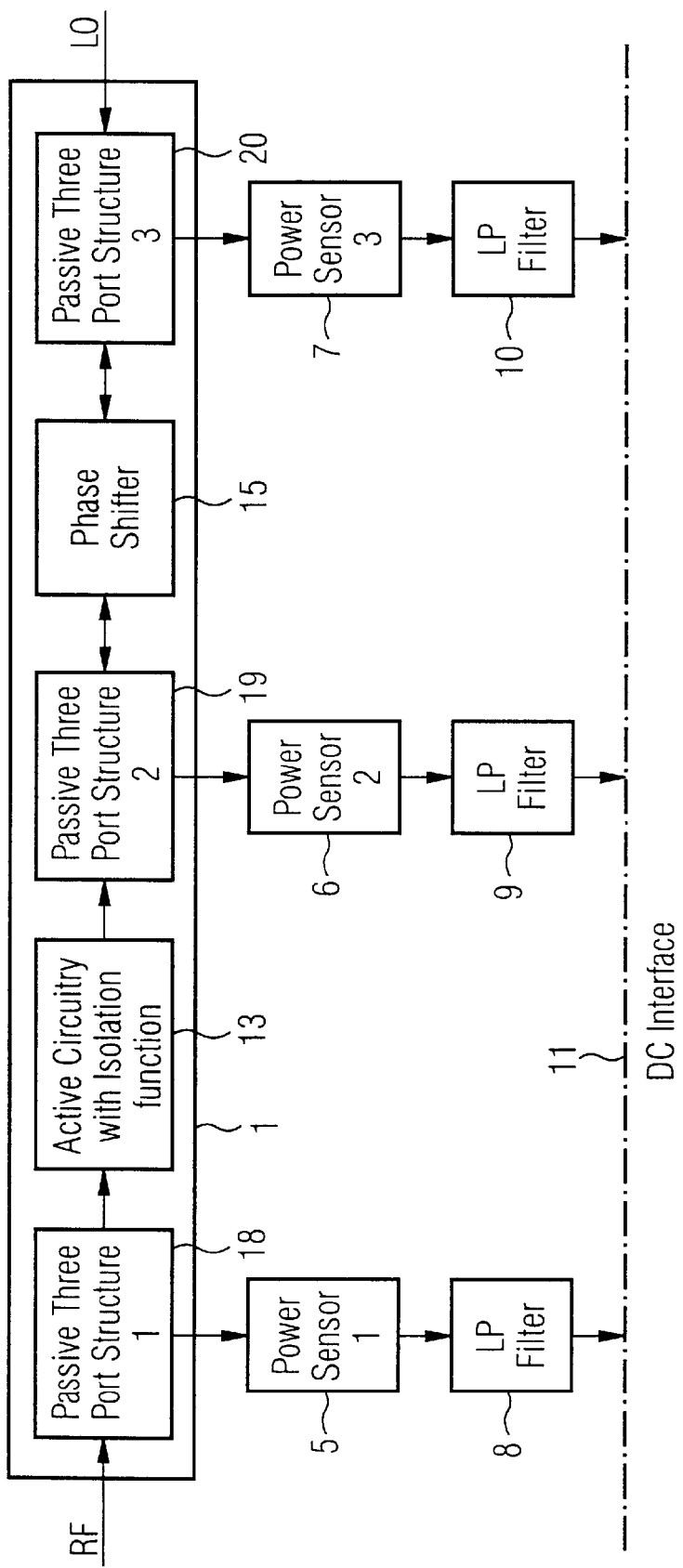
FIG. 5 shows a still further embodiment of the present invention (five-port junction)

FIG. 5 shows a further embodiment of the present invention, i.e. another implementation of a five port receiver. In comparison to the embodiment according to FIG. 2, the passive four port structure 14 of FIG. 2 is substituted by two passive three port structures 19, 20 connected with each other by means of a phase shifter 15. Therefore the five port junction receiver according to the embodiment of FIG. 5 comprises a first passive three port structure 18, a second passive three port structure 19 as well as a third passive three port structure 20.

Figure 6:
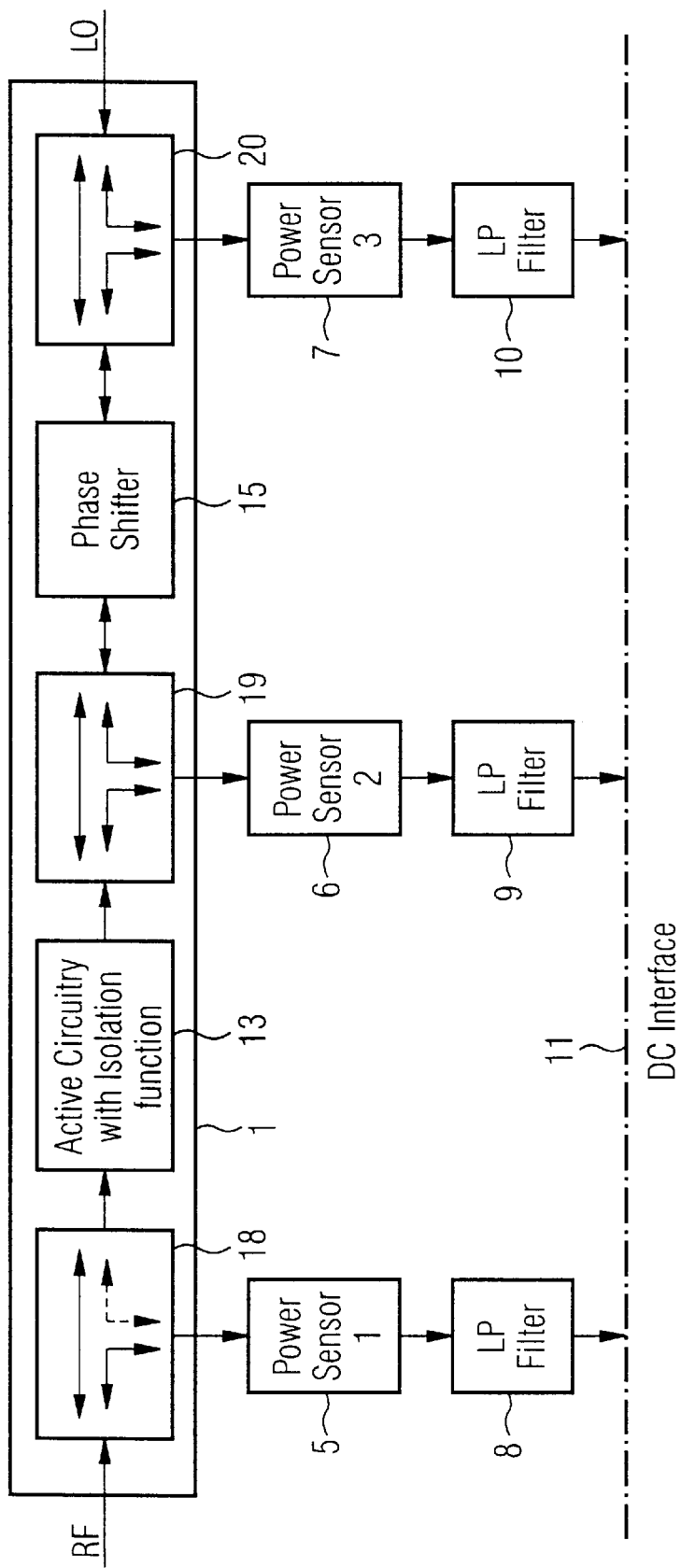
FIG. 6 shows a functional representation of FIG. 5.

FIG. 6 shows a functional representation of the five port receiver according to the embodiment of FIG. 5. Particularly the function of the passive three port structures 18, 19, 20 is explained.

FIG. 7a to FIG. 7f show different implementation of a passive three port structure by means of resistive structures (FIG. 7a, b, c, f) and microstrip and coplanar waveguide structures (FIG. 7d, e) respectively.

FIG. 8 shows implementations of the isolation block 13 by means of a single amplifier (FIG. 8a) and a combination of a first passive circuitry, which can be resistive and/or reactive 21, an amplifier 22 and a second passive circuitry which can and/or reactive 23.

Generally it is to be noted that the active circuitry 13 with isolation function can be realized by a plurality of implementation options, and FIG. 8 is only showing two possible realization options. The active circuitry 13 with isolation function is preferably realized in an integrated form with the other components of the N-port circuitry. The active circuitry 13 with isolation function does not necessarily need to have an ideal input and output match, but only know input and output reflection as it will be explained in the mathematical description of the N-port junction later on.

In the FIG. 9 the five-port receiver structure is presented, considering the non-ideal behavior, where all passive and active ports are considered to have complex reflection coefficients.

In FIG. 9 the RF signal (complex wave amplitudes $a_1$, $b_1$) is fed to a three port characterized by its scattering parameter matrix [R]. This three port structure contains the passive three port structure Nr. 1 of the FIG. 5 followed by active device with isolation function from the same figure. Note that complex amplitudes $b_1$, $d_1$, $a_5$, $a_4$, $a_3$ and $b_2$ are presenting unwanted reflected waves.

One of the "three port" —ports is connected with a first power sensor, which may have a reflection $\Gamma_5$ and senses the power of the incoming wave ($|b_5|^2$). The other output ($c_1$, $d_1$) feeds a general 4 port structure which in more detail consists of two three ports ($\overline{S}$, $\overline{T}$) and a 2 port. The latter acts as a phase shifter and is characterized by its scattering parameters $\overline{P}$. The output powers of the four-port, again, are measured by power sensors (PS), which may have reflection coefficients $\Gamma_4$ and $\Gamma_3$. On the right hand side the local oscillator signal ($a_2$) with its reflection ($b_2$) is the input to the five-port. With this structure, the five-port can be generally described by following matrix equation:

$$\begin{pmatrix} b_1 \\ b_2 \\ b_3 \\ b_4 \\ b_5 \end{pmatrix} = \overline{M} \begin{pmatrix} a_1 \\ a_2 \\ a_3 \\ a_4 \\ a_5 \end{pmatrix} = \begin{pmatrix} m_{11} & m_{12} & m_{13} & m_{14} & m_{15} \\ m_{21} & m_{22} & m_{23} & m_{24} & m_{25} \\ m_{31} & m_{32} & m_{33} & m_{34} & m_{35} \\ m_{41} & m_{42} & m_{43} & m_{44} & m_{45} \\ m_{51} & m_{52} & m_{53} & m_{54} & m_{55} \end{pmatrix} \begin{pmatrix} a_1 \\ a_2 \\ a_3 \\ a_4 \\ a_5 \end{pmatrix} \quad (1)$$

All the elements of the general scattering matrix $\overline{M}$ can be analytically determined from $\overline{R}$, $\overline{S}$, $\overline{T}$ and $\overline{P}$ via the more explicit equations:

$$\begin{pmatrix} b_1 \\ c_1 \\ b_5 \end{pmatrix} = \begin{pmatrix} r_{11} & r_{12} & r_{13} \\ r_{21} & r_{22} & r_{23} \\ r_{31} & r_{32} & r_{33} \end{pmatrix} \begin{pmatrix} a_1 \\ d_1 \\ a_5 \end{pmatrix} \quad (2)$$

$$\begin{pmatrix} b_1 \\ c_2 \\ b_4 \end{pmatrix} = \begin{pmatrix} s_{11} & s_{12} & s_{13} \\ s_{21} & s_{22} & s_{23} \\ s_{31} & s_{32} & s_{33} \end{pmatrix} \begin{pmatrix} c_1 \\ d_2 \\ a_4 \end{pmatrix} \quad (3)$$

$$\begin{pmatrix} d_3 \\ b_2 \\ b_3 \end{pmatrix} = \begin{pmatrix} t_{11} & t_{12} & t_{13} \\ t_{21} & t_{22} & t_{23} \\ t_{31} & t_{32} & t_{33} \end{pmatrix} \begin{pmatrix} c_3 \\ a_2 \\ a_3 \end{pmatrix} \quad (4)$$

$$\begin{pmatrix} d_2 \\ c_3 \end{pmatrix} = \begin{pmatrix} p_{11} & p_{12} \\ p_{21} & p_{22} \end{pmatrix} \begin{pmatrix} c_2 \\ d_3 \end{pmatrix} \quad (5)$$

further matrix manipulation leads to $$\overline{K}\vec{c} = \overline{\overline{A_1}}\vec{a} = \quad (6)$$

$$\begin{pmatrix} -1 & r_{22} & 0 & 0 & 0 & 0 \\ s_{11} & -1 & 0 & s_{12} & 0 & 0 \\ s_{21} & 0 & -1 & s_{22} & 0 & 0 \\ 0 & 0 & p_{11} & -1 & 0 & p_{12} \\ 0 & 0 & p_{21} & 0 & -1 & p_{22} \\ 0 & 0 & 0 & 0 & t_{11} & -1 \end{pmatrix} \begin{pmatrix} c_1 \\ d_1 \\ c_2 \\ d_2 \\ c_3 \\ d_3 \end{pmatrix} = \begin{pmatrix} r_{21} & 0 & 0 & 0 & r_{23} \\ 0 & 0 & 0 & s_{13} & 0 \\ 0 & 0 & 0 & s_{21} & 0 \\ 0 & 0 & 0 & 0 & 0 \\ 0 & 0 & 0 & 0 & 0 \\ 0 & t_{12} & t_{13} & 0 & 0 \end{pmatrix} \vec{a}$$

and $$\vec{b} = \overline{L}\vec{c} + \overline{\overline{A_2}}\vec{a} = \quad (7)$$

$$\begin{pmatrix} 0 & r_{12} & 0 & 0 & 0 & 0 \\ 0 & 0 & 0 & 0 & t_{21} & 0 \\ 0 & 0 & 0 & 0 & t_{31} & 0 \\ s_{31} & 0 & 0 & s_{32} & 0 & 0 \\ 0 & r_{32} & 0 & 0 & 0 & 0 \end{pmatrix} \vec{c} = \begin{pmatrix} r_{11} & 0 & 0 & 0 & r_{13} \\ 0 & t_{22} & t_{23} & 0 & 0 \\ 0 & t_{32} & t_{33} & 0 & 0 \\ 0 & 0 & 0 & s_{33} & 0 \\ r_{31} & 0 & 0 & 0 & r_{33} \end{pmatrix} \vec{a}.$$

Thus the scattering parameters of the complete five-port are found to be $$\overline{M} = (\overline{L}\overline{K}^{-1}\overline{\overline{A_1}} + \overline{\overline{A_2}}). \quad (8)$$

If the outputs are not matched and exhibit reflection coefficients $\Gamma_{1,5}$ with $$\vec{a} = \overline{\Gamma}\vec{b} + \vec{\alpha}_0 = \begin{pmatrix} \Gamma_1 & 0 & 0 & 0 & 0 \\ 0 & \Gamma_2 & 0 & 0 & 0 \\ 0 & 0 & \Gamma_3 & 0 & 0 \\ 0 & 0 & 0 & \Gamma_4 & 0 \\ 0 & 0 & 0 & 0 & \Gamma_5 \end{pmatrix} \vec{b} + \begin{pmatrix} s_1 \\ s_2 \\ 0 \\ 0 \\ 0 \end{pmatrix} \quad (9)$$

where $s_1$ and $s_2$ are the initial values for the RF and LO signal, respectively. Incorporating this into the equations above, the outgoing waves can be expressed as functions of the input signals, the structure of the five-port (S-parameters), and the mismatch of all the ports:

$$\vec{b} = (\overline{I} - \overline{MT})^{-1}\overline{M}\vec{\alpha}_0 = \overline{M}'\vec{\alpha}_0 \quad (10)$$

Hence, the detected powers $|b_3|^2$ to $|b_5|^2$ can be expressed as functions of the impressed signal, the S-parameters, and the mismatch of the ports. With some simple arithmetic one obtains $$\vec{p} = \begin{pmatrix} |b_3|^2 \\ |b_4|^2 \\ |b_5|^2 \end{pmatrix} = \overline{D} \begin{pmatrix} |s_1|^2 \\ |s_2|^2 \\ I|s_2|^2 \\ Q|s_2|^2 \end{pmatrix} = \begin{pmatrix} d_{11} & d_{12} & d_{13} & d_{14} \\ d_{21} & d_{22} & d_{23} & d_{24} \\ d_{31} & d_{32} & d_{33} & f_{34} \end{pmatrix} \begin{pmatrix} |s_1|^2 \\ |s_2|^2 \\ I|s_2|^2 \\ Q|s_2|^2 \end{pmatrix} \quad (11)$$

$$= \begin{pmatrix} |m_{31}|^2 & |m_{32}|^2 & 2\mathrm{Re}\{m_{32}m_{31}^*\} & -2\mathrm{Im}\{m_{32}m_{31}^*\} \\ |m_{41}|^2 & |m_{42}|^2 & 2\mathrm{Re}\{m_{42}m_{41}^*\} & -2\mathrm{Im}\{m_{42}m_{41}^*\} \\ |m_{51}|^2 & |m_{43}|^2 & 2\mathrm{Re}\{m_{52}m_{51}^*\} & -2\mathrm{Im}\{m_{52}m_{51}^*\} \end{pmatrix} \begin{pmatrix} |s_1|^2 \\ |s_2|^2 \\ I|s_2|^2 \\ Q|s_2|^2 \end{pmatrix} \quad (12)$$

If the local oscillator signal $S_2$ is known and all three powers are measured, the matrix $\overline{D}$, which consists of column 1, 3 and 4 of $\overline{D}$, can be inverted. Thus, power, real, and imaginary parts of the RF signal can be calculated. Note that the conditions for matrix inversion are almost always provided.

In phase (I) and quadrature phase (Q) components of $s_1$ are determined by $$I + jQ = \frac{s_1}{s_2} = (\mathrm{Re}\{s_1 s_2^*\} + j\mathrm{Im}\{s_2 s_2^*\})/|s_2|^2 \quad (13)$$

The equations can be further simplified, if the first three-port (R) contains an ideal isolator, which isolates input ($d_1$) from all other ports ($r_{12} = r_{32} = 0$). Under these conditions $m'_{32}$ vanishes and so do elements 2, 3, 4 in row 3 of $\overline{D}$ and $|s_1|^2 = |m_{51}|^{-2}|b_5|^2$. So the different IQ-values of the RF signal are straightforwardly calculated via $$\begin{pmatrix} I \\ Q \end{pmatrix} = \frac{1}{dd|s_2|^2} \quad (14)$$

$$\begin{pmatrix} d_{24} & -d_{14} & (-d_{11}d_{24} + d_{14}d_{21})Id_{31} & -d_{12}d_{24} + d_{14}d_{22} \\ -d_{23} & d_{13} & (d_{11}d_{23} - d_{13}d_{21})Id_{31} & d_{12}d_{23} - d_{13}d_{22} \end{pmatrix} \begin{pmatrix} |b_3|^2 \\ |b_4|^2 \\ |b_5|^2 \\ |s_2|^2 \end{pmatrix}$$

where dd is the determinant of the matrix $\overline{D}$; $dd = d_{13}d_{24} - d_{14}d_{23}$.

It becomes clear, that the complex information can be gained from two four-by-four real vector multiplications.

However, the initial s-parameters have to be known and some mild conditions have to be met for the phase shifter and the three ports $\overline{R}$ and $\overline{S}$.

This mathematical background shows that proposed N-port receiver, with incorporated active circuitry with the isolation function may function also in the case when unwanted reflections from active devices, power sensors and from passive blocks, are existing.

The basic requirement is that one has to know related complex values from the technological process, which is in principle possible. This is specifically true if the whole structure is realized by integrated techniques, like a typical MMIC approach. Moreover the simplest active non-matched active device with isolator function like amplifier may be used for the N-port direct receiver.

N-port Receiver Example With Active Circuitry With Isolation Function

Five-port receiver is investigated as a typical example for proposed solution.

Three port "R": ideally matched resistive power splitter with splitting factor r=0.5 (6 dB splitter) for all connections followed by an amplifier structure, with fixed gain.

The latter has ideal isolation, amplification v and complex mismatches $i_{11}$ and $i_{22}$ at input and output, respectively.

Three ports "S" and "T" are also ideally matched resistive power dividers, (6 dB splitters)

Phase shifter P with phase shift 45°, no losses, ideally matched.

Then the matrix D is found to be $$\overline{D} = \begin{pmatrix} \frac{|v|^2}{64} & \left|\frac{1}{2} + \frac{ji_{22}}{16}\right|^2 & \frac{\sqrt{2}}{16}\mathrm{Re}\left(v*(1+j)\left(1+\frac{ji_{22}}{8}\right)\right) & -\frac{\sqrt{2}}{16}\mathrm{Im}\left(v*(1+j)\left(1+\frac{ji_{22}}{8}\right)\right) \\ \frac{|v|^2}{64} & \left|\frac{\sqrt{2}}{8}(-1+j)\left(1+\frac{i_{22}}{2}\right)\right|^2 & \frac{\sqrt{2}}{16}\mathrm{Re}\left(v*(1-j)\left(1+\frac{i_{22}}{2}\right)\right) & -\frac{\sqrt{2}}{16}\mathrm{Im}\left(v*(1-j)\left(1+\frac{ji_{22}}{2}\right)\right) \\ \left|\frac{1}{2} + \frac{i_{11}}{4}\right|^2 & 0 & 0 & 0 \end{pmatrix} \quad (15)$$

Thus, if equal amplitudes of the exciting waves $s_1$, $S_2$ can be assumed, the different detected power levels are within one order of magnitude and port five is decoupled, containing only information on $|s_1|^2$.

In the ideal case of a perfectly matched amplifier circuit with real gain v, the equations are further simplified and the matrix D has elements as shown below.

$$\overline{D} = \begin{pmatrix} \frac{|v|^2}{64} & \left|\frac{1}{2}\right|^2 & -\frac{\sqrt{2}\,v}{16} & \frac{\sqrt{2}\,v}{16} \\ \frac{|v|^2}{64} & \frac{1}{16} & \frac{\sqrt{2}\,v}{16} & \frac{\sqrt{2}\,v}{16} \\ \frac{1}{4} & 0 & 0 & 0 \end{pmatrix} \quad (16)$$

Now the IQ-values are directly calculated from:

$$\begin{pmatrix} I \\ Q \end{pmatrix} = \frac{4\sqrt{2}}{v|s_2|^2} \begin{pmatrix} 1 & 1 & -\frac{5}{16v^2} & -\frac{5}{16} \\ -1 & 1 & -\frac{3}{16v^2} & \frac{3}{16} \end{pmatrix} \begin{pmatrix} |b_3|^2 \\ |b_4|^2 \\ |b_5|^2 \\ |s_2|^2 \end{pmatrix} \quad (17)$$

Figure 10:
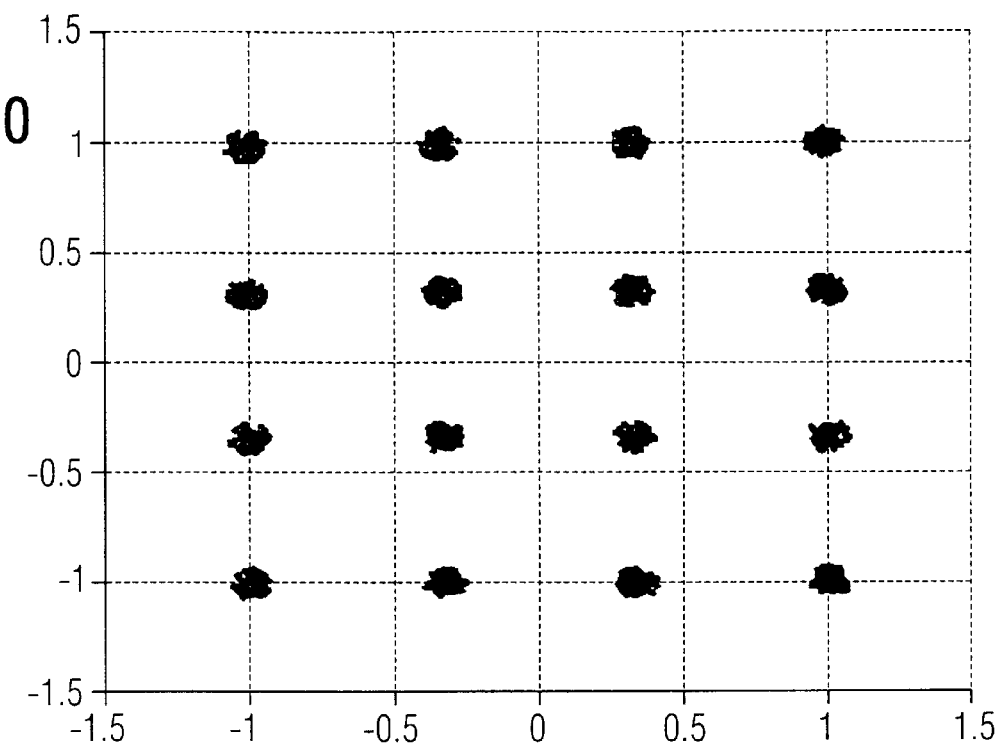
FIG. 10 shows a simulation result in the case of a input RF signal with a signal noise ratio of 26 dB.
Figure 11:
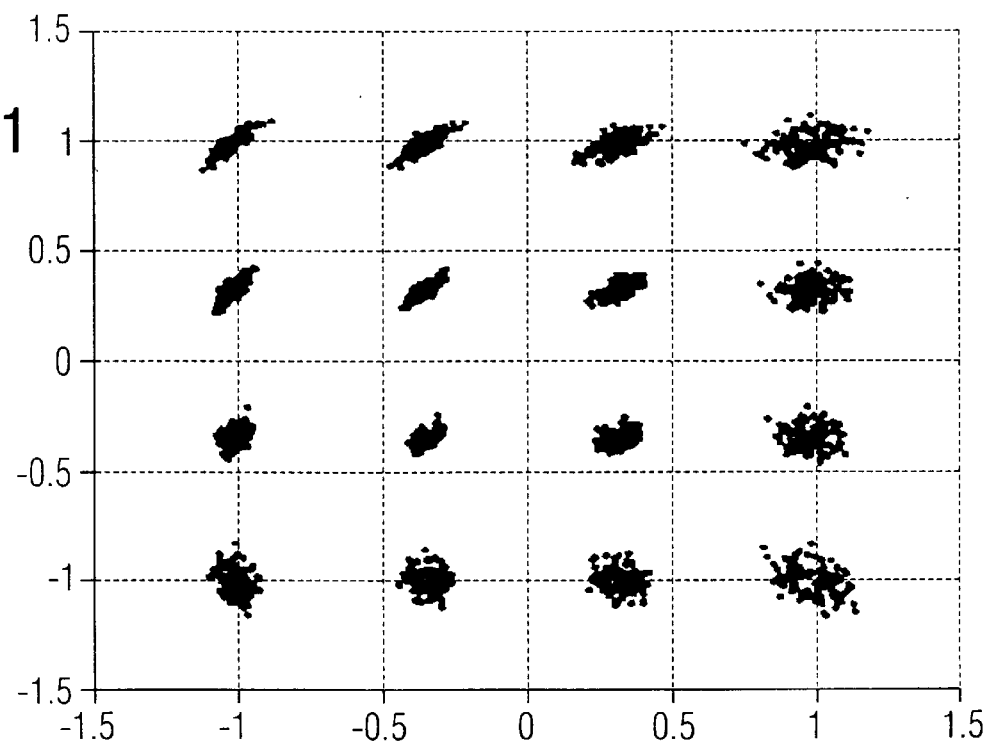
FIG. 11 shows a further simulation result for the case of a five-port receiver output with 5% tolerances, without any calibration and with an ideal signal to noise ratio of the RF input signal.
Figure 12:
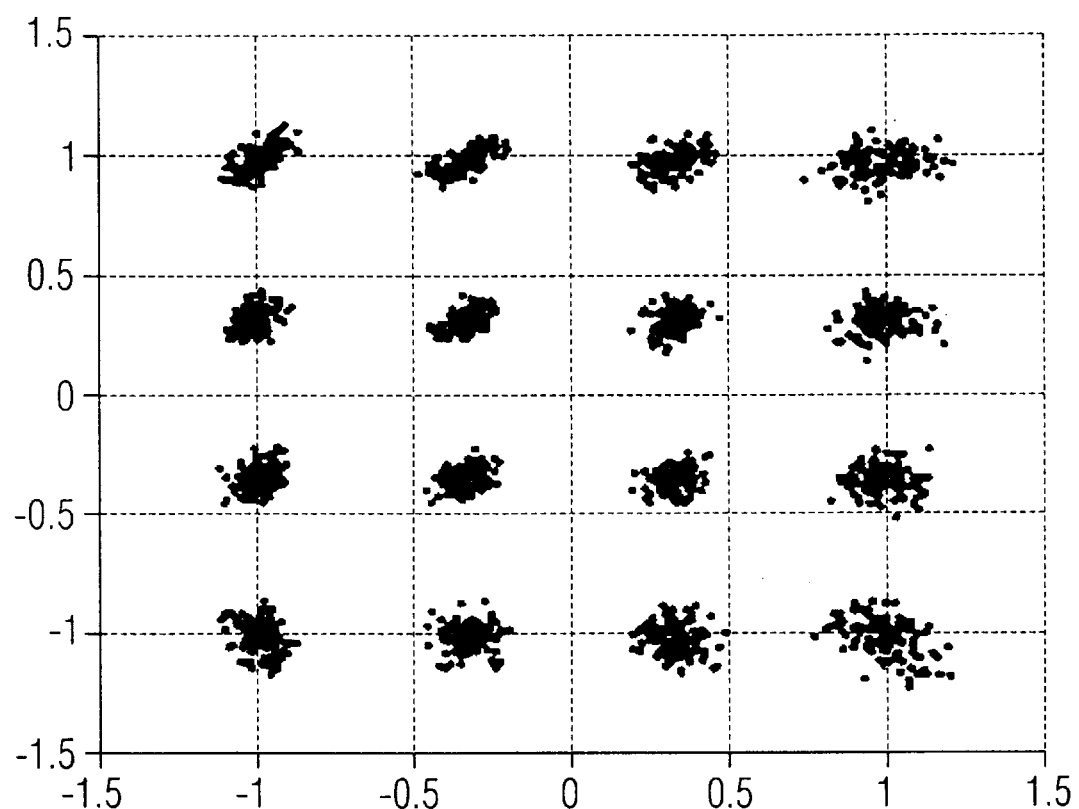
FIG. 12 shows a simulation result for a five-port receiver output signal with 5% tolerances and a signal to noise ratio of the signal input to the first RF port of 26 dB.

Table of the used variables:
$s_1$ RF signal to be I/Q demodulated
$s_2$ Second RF signal (known, usually local oscillator)
$\vec{\alpha}_0$ Vector of initial wave amplitudes $s_1$, $s_2$
$\overline{R}$, $\overline{S}$, $\overline{T}$ Scattering matrices of the 3-port junctions
vGain of the amplifier stage (complex)
$i_{11}, i_{22}$ Complex input and output reflection coefficients of the amplifier
I,Q In—and quadrature phase components of $s_1$
$b_3, b_4, b_5$ Outgoing complex wave amplitude at the power sensors (only their power is detected)
$\overline{M}$ Scattering parameters of the complete 5-port
$\overline{D}$ Linear matrix, describing the connection between detected powers and input powers and IQ-values
dd Determinant of a part of $\overline{D}$
Table 2. Legend of used Variables Simulation Results An example for 5-port structure (related to the FIG. 5) was investigated. All three port structures are considered as the same. Each of them is treated as star connected resistors, where each of them is having Z/3 Ohm resistance (Z is taken to be 50 Ohm). Each resistor has parasitic reactive part of Z/60 Ohm. Active circuitry with isolation function is realized by the simple non-matched amplifier having 6 dB gain, and equal input and output reflection loss of $S_{11}=S_{22}=-6$ dB. Results are presented for 16 QAM signals, with and without associated noise. Random tolerances of maximum +/−5% for resistor values, amplifier complex reflection coefficient and amplifier gain are considered. Simulation results show good performance without any calibration. It is expected that using calibration, the performance may be improved. Related results are presented in the FIG. 10–12.

As shown in FIG. 8b, the passive circuitries 21 and 23 serve as a matching circuitry. The active circuitry 13, as has been already said, having an isolation function can be integrated with the other components of the N-port circuitry preferably with MMIC technology. The attached power sensors (5, 6, 7 in FIG. 1) need not to be matched to the system impedance. The three port structures of the different embodiments do not need to be matched to 50 Ohm.

What is claimed is:

1. Method for receiving modulated RF signals, the method comprising the following steps:
    feeding a first RF signal to a first input connected to a first passive structure of a N-port junction, N being an integer larger than 2,
    feeding a second RF signal to a second input connected to a second passive structure of the N-port junction, the first and second passive structure respectively having at least one output to a power sensor,
    supplying M=N−2 output signals of the N-port junction to power sensors, and
    isolating the first passive structure from the second passive structure by a non-reciprocal two-port isolation unit.

2. Method for receiving modulated RF signals according to claim 1, characterized in that the non-reciprocal two-port isolation unit is an active isolation unit.

3. Method for receiving modulated RF signals according to claim 1, characterized in that the second RF signal originates from a local oscillator.

4. RF receiver, comprising
    an N-port junction, N being an integer larger than 2, wherein the N-port junction is supplied with a first RF signal at a first input connected to a first passive structure and with a second RF signal at a second input connected to a second passive structure, the first and second passive structure respectively being connected to at least one power sensor, and
    an isolation block comprising a non-reciprocal two-port circuitry for isolating the second passive structure from the first passive structure.

5. RF receiver according to claim 4, characterized in that the isolation block comprises attenuators.

6. RF receiver according to claim 4, characterized in that non-reciprocal two-port isolation circuitry is an active isolation unit.

7. RF receiver according to claim 5, characterized in that the active circuitry is an amplifier.

8. RF receiver, comprising:
    an N-port junction, N being an integer larger than 2, wherein the N-port junction is supplied with a first RF signal at a first input and with a second RF signal at a second input, and
    an isolation block comprising a non-reciprocal two-port circuitry for isolating the second input from the first input, characterized in that the isolation block further comprises at least one passive circuitry providing for a resistive or reactive matching.

9. RF receiver, comprising:
    an N-port junction, N being an integer larger than 2, wherein the N-port junction is supplied with a first RF signal at a first input and with a second RF signal at a second input, and
    an isolation block comprising a non-reciprocal two-port circuitry for isolating the second input from the first input, characterized in that the N-port junction comprises at least one of a three-port junction and a four-port junction and the isolation block is connected between one of the first and second input of the N-port junction and the at least one of three-port junction and a four-port junction.

10. RF receiver, comprising:
    an N-port junction, N being an integer larger than 2, wherein the N-port junction is supplied with a first RF signal at a first input and with a second RF signal at a second input, and
    an isolation block comprising a non-reciprocal two-port circuitry for isolating the second input from the first input, characterized in that the N-port junction comprises at least two three-port junctions and the isolation block is connected between two three-port junctions.

11. RF receiver, comprising:

an N-port junction, N being an integer larger than 2, wherein the N-port junction is supplied with a first RF signal at a first input and with a second RF signal at a second input, and an isolation block comprising a non-reciprocal two-port circuitry for isolating the second input from the first input, characterized in that the N-port junction comprises at least one three-port junction and at least one four-port junction and the isolation block is connected between a three-port junction and a four-port junction.

12. RF receiver, comprising:

an N-port junction, N being an integer larger than 2, wherein the N-port junction is supplied with a first RF signal at a first input and with a second RF signal at a second input, and an isolation block comprising a non-reciprocal two-port circuitry for isolating the second input from the first input, characterized in that N-port junction comprises at least one phase shifter.

\* \* \* \* \*